United States Patent [19]
Ajit

[11] Patent Number: 5,623,151
[45] Date of Patent: Apr. 22, 1997

[54] MOS-GATED POWER SEMICONDUCTOR DEVICES WITH CONDUCTIVITY MODULATION BY POSITIVE FEEDBACK MECHANISM

[75] Inventor: Janardhanan S. Ajit, Redondo Beach, Calif.

[73] Assignee: International Rectifier Corporation, El Segundo, Calif.

[21] Appl. No.: 491,250

[22] Filed: Jun. 16, 1995

[51] Int. Cl.⁶ .................................................. H01L 23/58
[52] U.S. Cl. ......................... 257/212; 257/273; 257/335; 257/341; 257/342; 257/401
[58] Field of Search ................................. 257/139, 141, 257/142, 143, 341, 342, 135, 273, 329, 401, 495, 212, 335

[56] References Cited

U.S. PATENT DOCUMENTS 5,357,120  10/1994  Mori ............................................ 257/38

OTHER PUBLICATIONS

J.S. Ajit et al., "Comparison of MOS-Gated Bipolar Transistor Structures", *EPE-MADEP Symposium on Materials and Devices for Power Electronics-MADEP Proceedings*, 2-6 Sep., 1991.

*Primary Examiner*—Minhloan Tran
*Attorney, Agent, or Firm*—Ostrolenk, Faber, Gerb & Soffen, LLP

[57] ABSTRACT

A MOS-gated power semiconductor device which combines bipolar conduction with MOS-gate control to achieve low on-state voltage drop while having fast-switching characteristics. A floating P injector region located at the upper surface of the device injects holes, and a grounded P collector region, also located at the upper surface of the device, collects the injected holes. A driver DMOSFET integrated in the structure couples the P injector region to the drain potential during the on-state of the device. The P collector region is configured in such that the driver DMOSFET is conductivity modulated by a positive feedback mechanism, thereby drastically reducing the on-resistance of the device at high current levels.

8 Claims, 15 Drawing Sheets

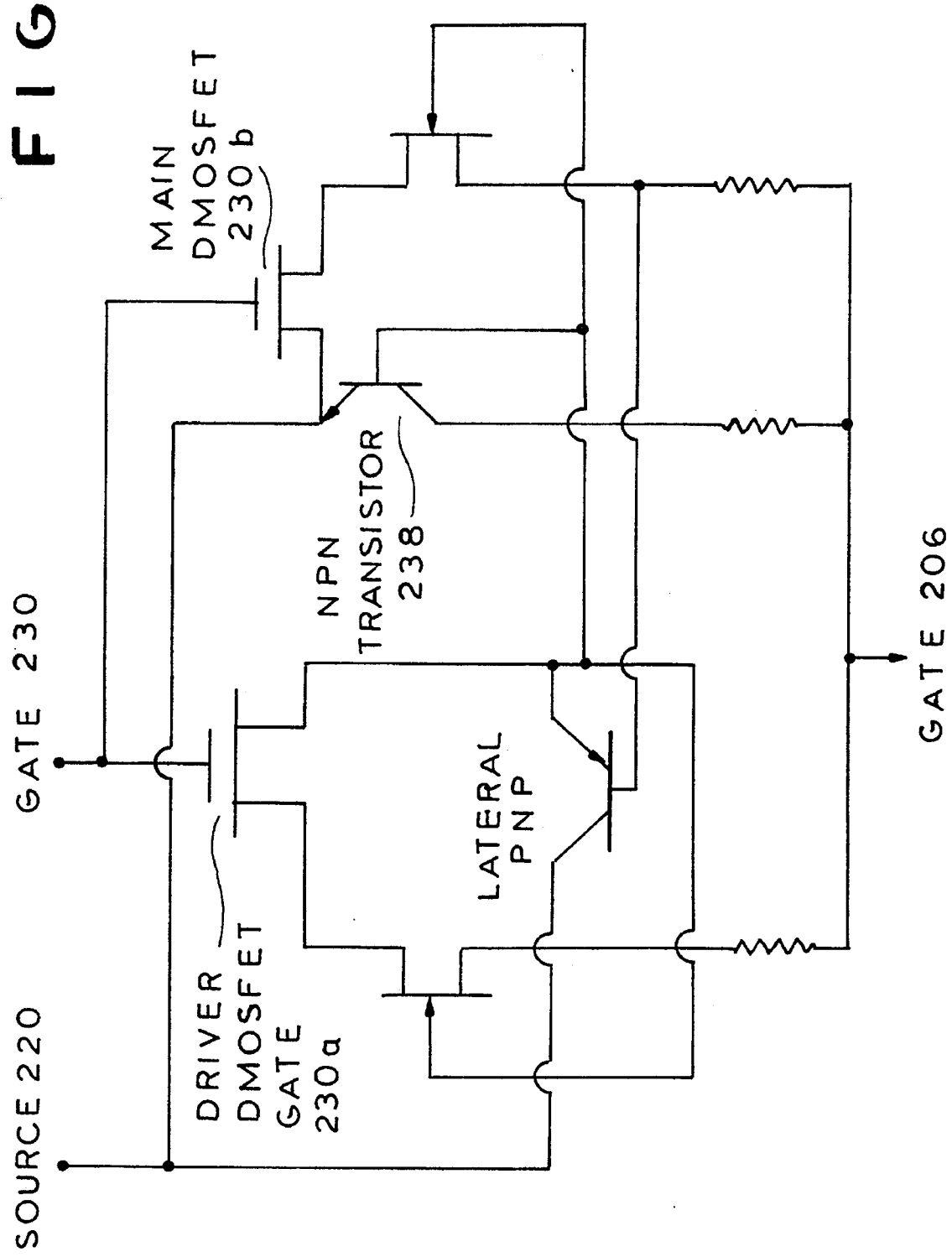

MOS-GATED POWER SEMICONDUCTOR DEVICES WITH CONDUCTIVITY MODULATION BY POSITIVE FEEDBACK MECHANISM

BACKGROUND OF THE INVENTION

1. Field Of The Invention

The present invention relates to MOS-gated semiconductor devices and, more specifically, MOS-gated semiconductor devices in which the upper regions of the device structures are conductivity modulated by a positive feedback mechanism.

2. Description Of The Related Art

During the last decade, the development of power devices with MOS-gate control has become accepted as the most promising approach for power switching applications. Among MOS-gate power devices, the most commonly used structure is the double-diffused power MOSFET (DMOSFET). The DMOSFET has fast switching characteristics. However, the on-resistance of the power DMOSFET increases very rapidly as the breakdown voltage is increased.

Bipolar current conduction has been utilized to develop devices with lower on-state voltage drop compared to the DMOSFET while still retaining the high input impedance MOS gate which allows simple control circuitry. The IGBT is one such device available commercially which has a lower on-state drop compared to the DMOSFET for high-voltage applications but has slow switching characteristics. The switching speed of the IGBT can only be improved by minority carrier lifetime reduction techniques, and the fastest switching IGBT's reported have turn-off times greater than 100 ns. Another problem with the IGBT is the possibility of latch-up of the parasitic thyristor inherent in the IGBT structure under certain device operating conditions. The current conduction capabilities of other three-terminal MOS-controlled bipolar structures, such as emitter-switched MOS-controlled bipolar transistors, are limited by the high on-resistance of the integrated high-voltage driver DMOSFET.

One structural innovation that has been reported to reduce the on-resistance of the DMOSFET while still retaining its switching speed is the minority carrier injection controlled field effect transistor (MICFET). The device structure of the MICFET, shown in FIG. 1, is similar to that of the DMOSFET, with the addition of a floating P injector region 2 whose potential can be controlled by an integrated vertical driver DMOSFET 4. During the blocking state, with zero potential applied to the gate, a high device breakdown voltage is obtained because the injector region 2 acts as a floating guard ring. When a positive gate bias is applied (for the n-channel structure shown in FIG. 1), current flow occurs via the main DMOSFET 6 at drain voltages below 0.7 volts. At higher drain voltages, the potential of the injector region 2 rises sufficiently to produce injection of minority carriers (holes) 8 into the drift region 10. The injected holes 8 conductivity modulate the JFET region 12 of the main DMOSFET 6, resulting in an increase in current density.

The hole current in the MICFET is provided by the vertical driver DMOSFET 4 integrated into the structure. However, since driver DMOSFET 4 is not conductivity modulated, the on-resistance of driver DMOSFET 4 limits the current conduction capability of the device. Thus, the MICFET shows improvement in current density of only about 20% over the DMOSFET at a forward drop of 2 volts.

Accordingly, a need exists for fast-switching, high voltage MOS-gated power semiconductor device with a low on-resistance at relatively high current levels.

SUMMARY OF THE INVENTION

The present invention fulfills the above need by providing a MOS-gated power semiconductor device which combines bipolar conduction with MOS-gate control to achieve low on-state voltage drop while having fast-switching characteristics. Advantageously, in the present invention, the integrated DMOSFET is conductivity modulated by a positive feedback mechanism, thereby drastically reducing the relatively high on-resistance of the device at high current levels.

The MOS-gated power device of the present invention is provided in three embodiments. In the first embodiment, a P injector region extends into a relatively lightly doped N-type layer (the $N^-$ drift region) of a semiconductor wafer from the upper surface of the wafer, the P injector region being contiguous with a P body region also extending into the relatively lightly doped N-type layer from the upper semiconductor surface. A first N-type region is disposed in the P body region, the first N-type region being electrically connected, by a metal strap disposed at the upper semiconductor surface, to the P body region, the metal strap being at a floating potential. The first N-type region is shallower than the P body region in which it is formed and is radially inwardly spaced along the upper semiconductor surface from the outer edge of the P body region, such that the outer edge of the P body region defines a n-channel region of a driver DMOSFET.

A P base region is also extends into the relatively lightly doped N-type layer from the upper semiconductor surface, the P base region being laterally spaced from said P injector region by a portion of the relatively lightly doped N-type region to define a JFET region;

A second N-type region, i.e. a emitter region, is formed in the P base region, the N-type emitter region being electrically connected to a source electrode at the upper semiconductor surface of the device. The N-type emitter region is shallower than the P base region and radially inwardly spaced along the upper semiconductor surface from the outer edge of the P base region, thereby defining a n-channel region of a main DMOSFET of the device.

A P-type collector region also extends into the relatively lightly doped N-type layer from the upper surface of the device. The P collector region is laterally spaced from the P body region and is connected to the source electrode.

An insulated gate is disposed over the n-channel region of the main DMOSFET, the n-channel region of the driver DMOSFET and the portions of the relatively lightly doped N-type region extending between the P regions at the upper surface of the device. Upon the application of a positive potential to the insulated gate, the main DMOSFET and said driver DMOSFET are turned on, the turning-on of the main DMOSFET providing a base drive for a lateral PNP transistor structure in the device, the turning-on of the driver DMOSFET connecting the P injector region to the drain, resulting in the injection of holes from the P injector region into the lightly doped lightly doped $N^-$ type layer (the $N^-$ drift region) and P base region to provide base drive for the vertical NPN transistor structure.

The P-type collector region diverts a portion of the injected holes to the current path of the driver DMOSFET, thereby conductivity modulating the driver DMOSFET and reducing the on-resistance of the driver DMOSFET, leading to increased injection of holes from the P injector region and further decreasing the on-resistance of the driver DMOSFET, resulting in a further increased injection of holes by way of a positive feedback mechanism until the driver DMOSFET.

A second embodiment of the invention is provided which is conceptually similar to the first embodiment described above, but is more compact in that, in the second embodiment, the P body and P base regions are both contiguous with the P+ injector region.

A third embodiment of the invention is provided which is "emitter-switched." In this embodiment, the N+ emitter is not connected directly to ground, but instead is left floating in the off-state and is connected to ground by a lateral n-channel MOSFET in the on-state.

Other features and advantages of the present invention will become apparent from the following description of the invention which refers to the accompanying drawings.

BRIEF DESCRIPTION OF THE DRAWINGS

FIG. 7 shows the equivalent circuit of the embodiment of FIG. 6.

DETAILED DESCRIPTION OF PREFERRED EMBODIMENTS

Figure 1:
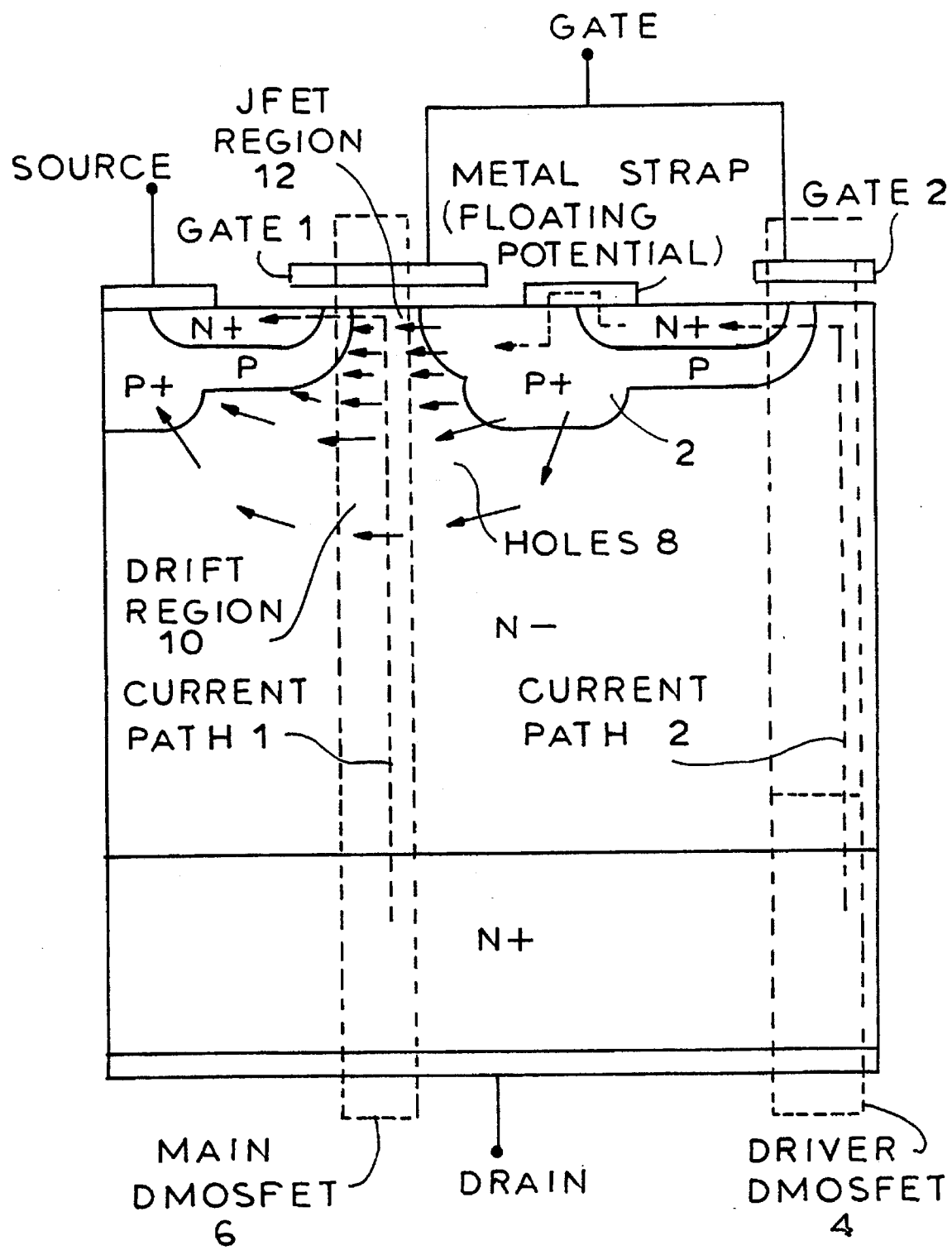
FIG. 1 shows a cross-sectional view of a prior art MICFET device.
Figure 2:
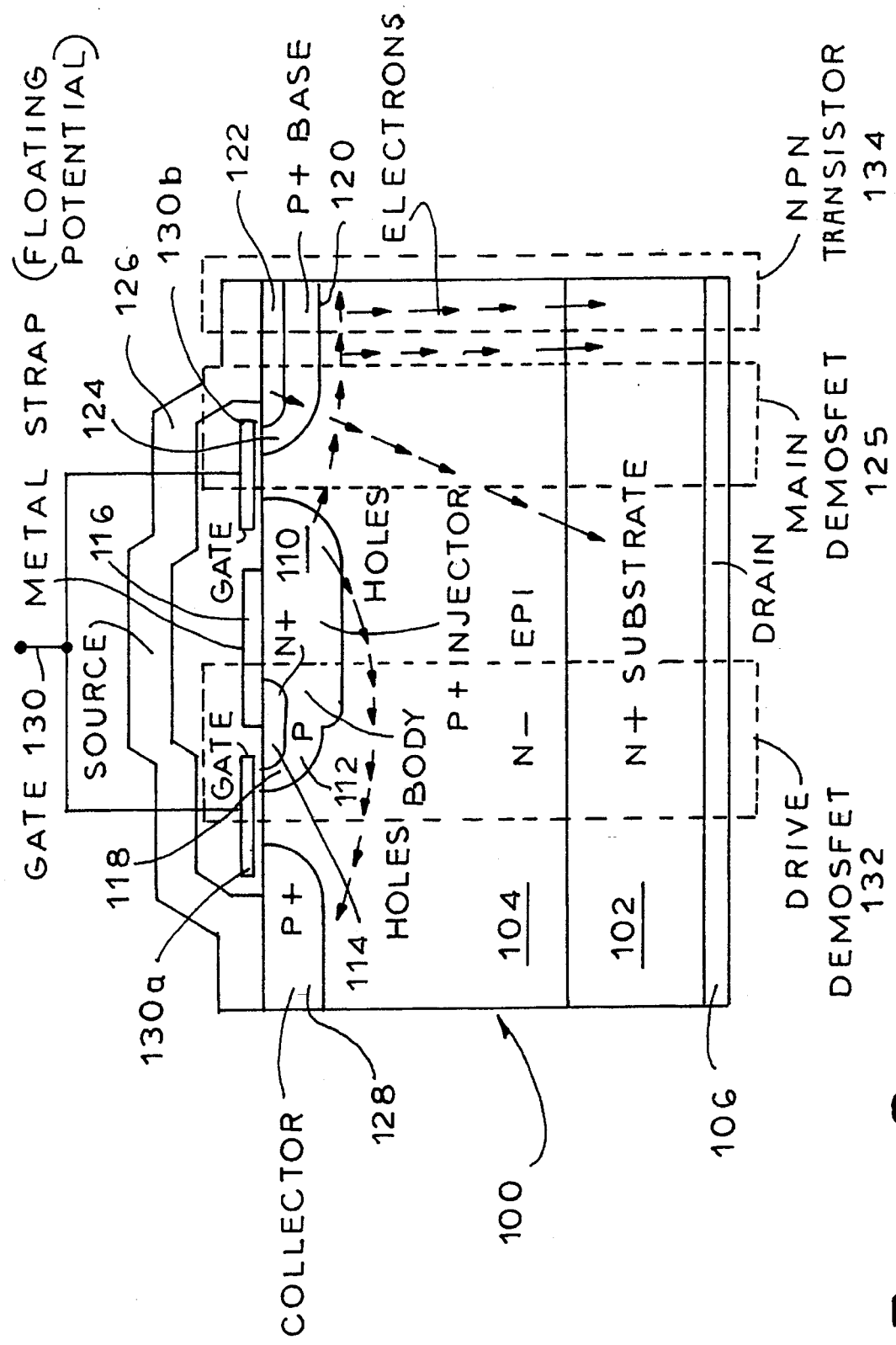
FIG. 2 shows a cross-sectional view of a first embodiment of the present invention.

A first embodiment of the MOS-gated power device of the present invention is shown in FIG. 2. MOS-gated device 100 is a vertical conduction device.

The device 100 is preferably formed on a N+ substrate 102 with an overlying N− epi layer 104. The N+ substrate 102 serves as the drain region of the device. A drain electrode 106 on the bottom surface of the device covers N+ substrate 102.

The layer thicknesses and concentrations depend on the device blocking voltage. For a 600 V device, the doping density and thickness of N− epi layer 104 are in the range of $2 \times 10^{14}$ cm$^{-3}$ and 40 μm, respectively. The doping density of N+ substrate 102 is preferably greater than $5 \times 10^{19}$ cm$^{-3}$, with a thickness greater than 250 μm.

A P+ injector region 110 is disposed within N− epi layer 104 and extends downward into the device from the upper surface. As shown in FIG. 2, a P body region 112 is formed within P+ injector region 110 on one side thereof and extends preferably to a shallower depth than P+ injector region 110.

A $N^+$ region 114 is formed in P body region 112. N+ region 114 is electrically shorted to P body 112 by a floating metal strap 116 (unconnected to any electrode of the device) disposed on the upper surface of the device. N+ region 114 is laterally spaced inward from the outer edge of P body 112 to form a n-channel region 118 of a driver DMOSFET 132, discussed below.

A P base region 120 is also disposed within N− epi layer 104 and extends downward into the device from the upper surface in spaced relationship to P+ injector region 110. A N+ emitter region 122 is formed in P base 120. N+ emitter region 122 is laterally spaced inwardly from the outer edge of P base 120 to form a n-channel region 124 of the main DMOSFET 125 of the device. N+ emitter region 122 is electrically connected to source electrode 126 on the upper surface of the device. Source electrode 126 is typically held at ground potential.

A P+ collector region 128, spaced from P+ injector region 110 and on the opposite side of P+ injector region 110 from P base 120, also extends into N− epi layer 104 from the upper surface of the wafer. Like N+ emitter region 122, P+ collector region 128 is connected to the source electrode 126 on the upper surface of the device.

A common insulated gate 130 overlays n-channel regions 118 and 124 and also extends over the adjacent portions of N− epi layer 104 which project upwardly in the spaces between P body region 112 and P collector region 128, and between P+ injector region 110 and P base 120, respectively. Insulated gate 130 is preferably comprised of polysilicon and is insulated from the upper surface of the device by a layer of oxide (not shown in FIG. 2).

Figure 3:
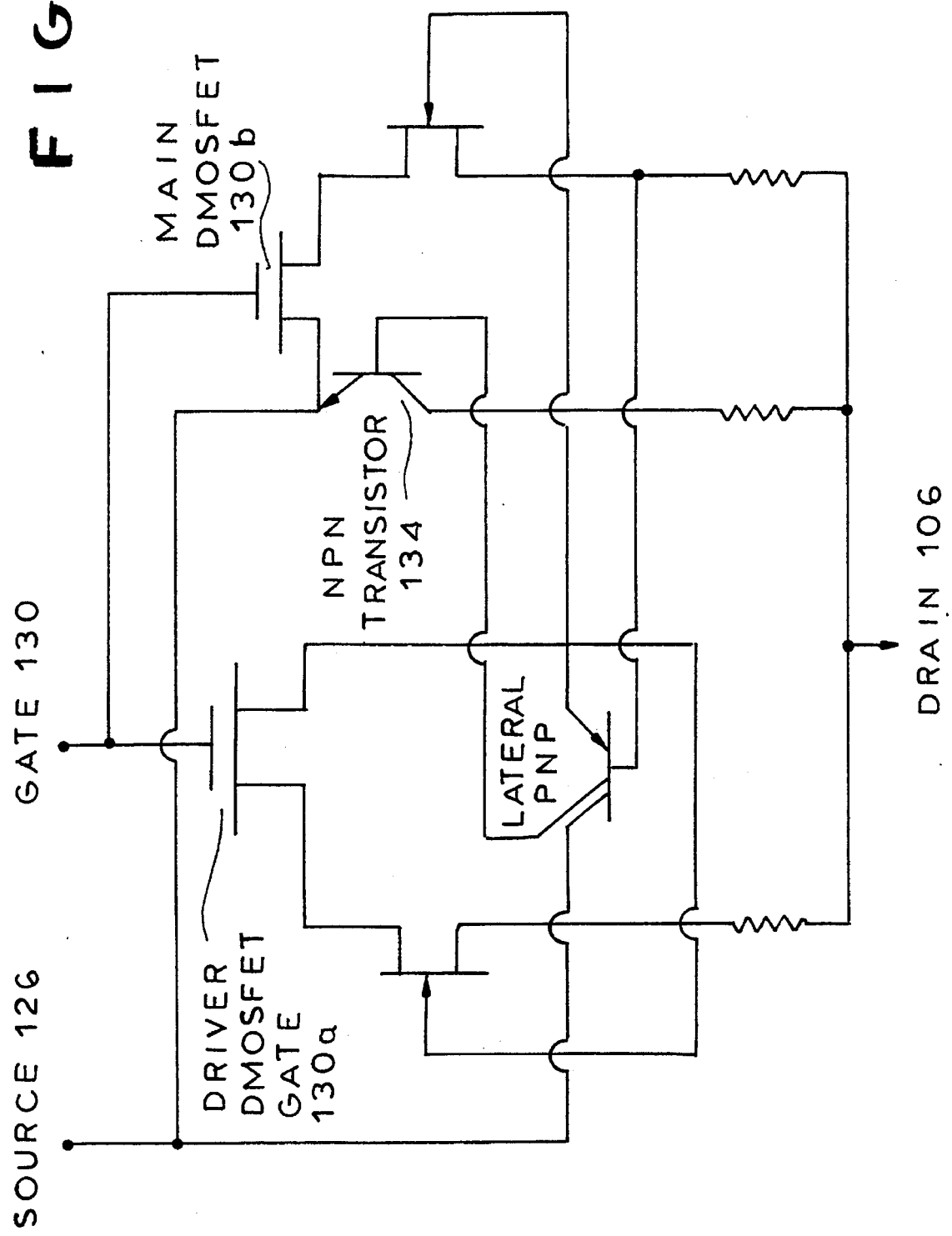
FIG. 3 shows the equivalent circuit of the embodiment of FIG. 2.

The above-described structure yields a device having a driver DMOSFET 132 which provides the base drive for a vertical NPN power transistor 134. Advantageously, in the present invention, as opposed to the prior art MICFET, the driver DMOSFET 132 is conductivity modulated and thus has a low on-resistance, thereby increasing the current density capability of the device. An equivalent circuit for the device of FIG. 2 is shown in FIG. 3.

More specifically, in the operation of the device of FIG. 2, with the drain at a positive potential with respect to the source and the gate also at a positive potential, floating P+ injector region 110 is coupled to the drain potential of the device by driver DMOSFET 132, and injects holes into P base 120, thus providing the base drive for vertical NPN power transistor 134. P+ collector region 128, connected to ground potential, is incorporated in the device structure in a position adjacent to the current path of driver DMOSFET 132 to divert part (about 15%) of the injected holes from P+ injector region 110 to the current path of the driver DMOSFET 132. This conductivity modulates the N− drift region and the JFET region of the driver DMOSFET 132 and reduces its on-resistance. The reduction of on-resistance of the driver DMOSFET 132 brings the potential of the P+ injector region 110 closer to drain potential, leading to increased injection of holes, which leads to further reduction of on-resistance of the driver DMOSFET 132, and so on by this positive feedback mechanism until driver DMOSFET 132 is saturated.

During turn-off, the excess electrons in the N-drift region are removed through the N+ drain 102, and since the injected holes are confined to the upper part of the device, they are easily removed through the P collector region 128. This allows for faster switching than an IGBT, in which excess electrons are trapped near the P+/N− drift region junction during turn-off and the injected holes are distributed in the lower part of the drift region.

In the off state of the device, a high breakdown voltage is achieved by connecting the P base 120 of the NPN transistor 134 to the ground potential of the P+ collector 128 through p-type inversion channels formed at the surface of the drift regions of the main DMOSFET 125 and the driver DMOSFET 132 by applying a negative bias (−10 V) to the gate 130. During turn-off, since the injected holes are confined to the upper part of the device, they are easily removed through the P+ collector 128 by the electric field, resulting in fast switching characteristics.

The device of the present invention is preferably provided in a cellular topology, FIG. 2 representing one-half of a unit cell. A top view of a full cell of the device, showing the contacts to the various regions, is depicted in FIG. 4.

Figure 4:
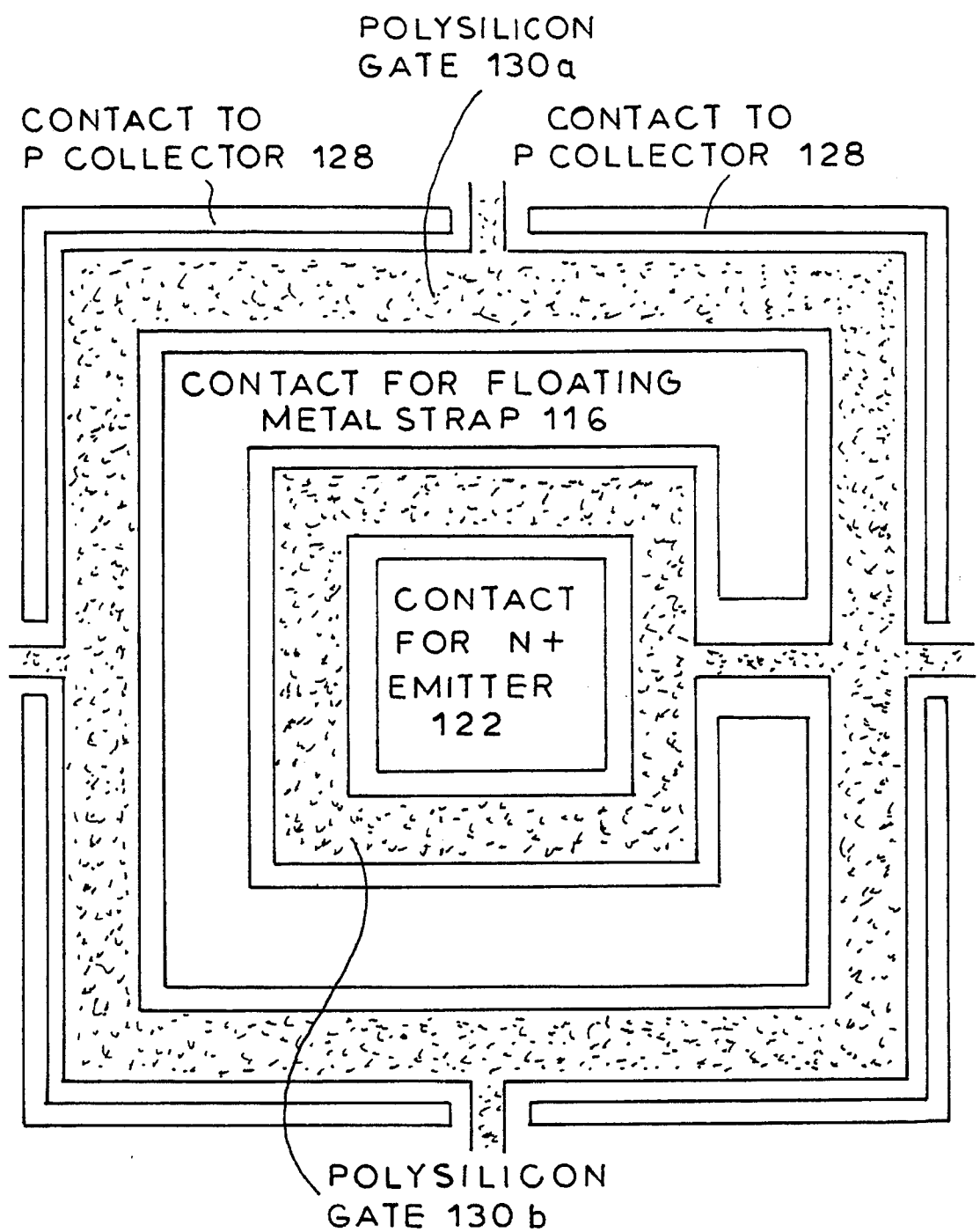
FIG. 4 shows a top view of a full cell of the embodiment of FIG. 2.

In order to evaluate the relative performance of the present invention, ordinary DMOSFET devices and multi-cell devices having the layout shown in FIG. 4 were fabricated, both with breakdown voltages of 750 V. The devices of the present invention were fabricated with an active area of 1.353 mm$^2$ and the DMOSFET devices fabricated had an active area of 1.315 mm$^2$.

Figure 5B:
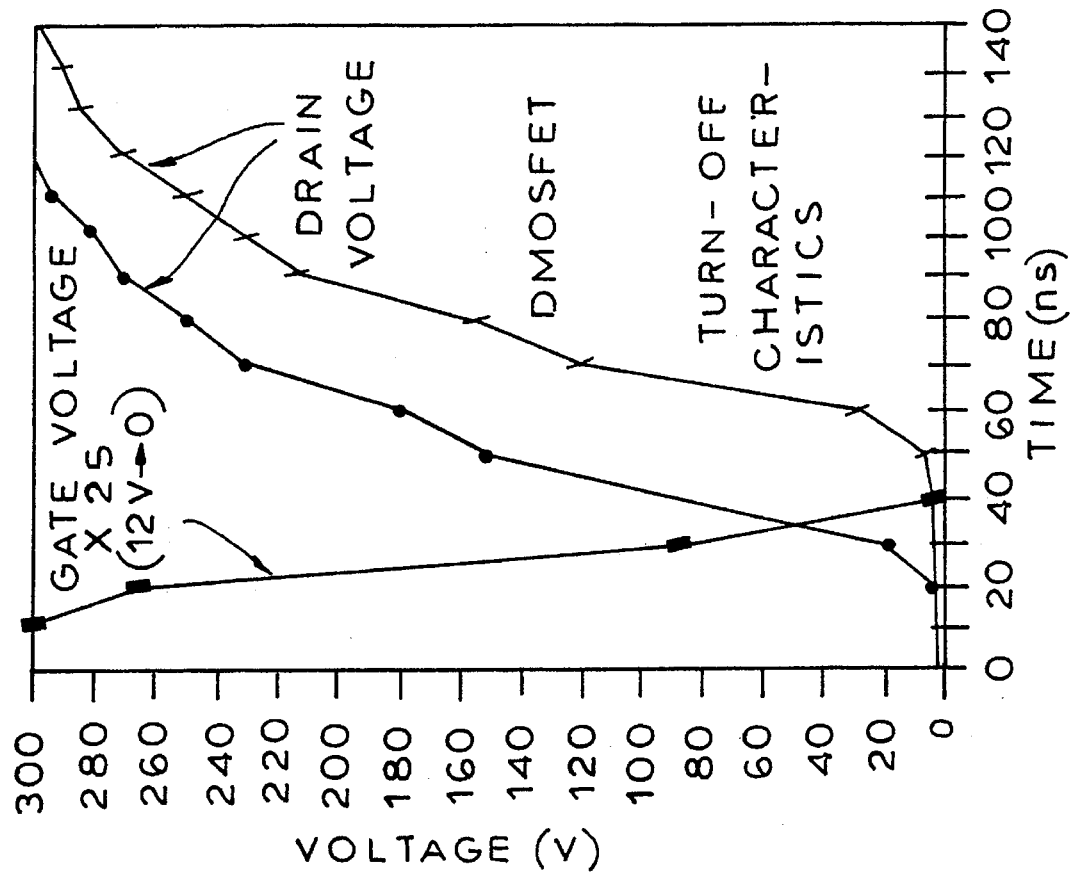
FIGS. 5A and 5B show the relative performance of the first embodiment of the present invention as compared to a conventional DMOSFET.
Figure 5A:
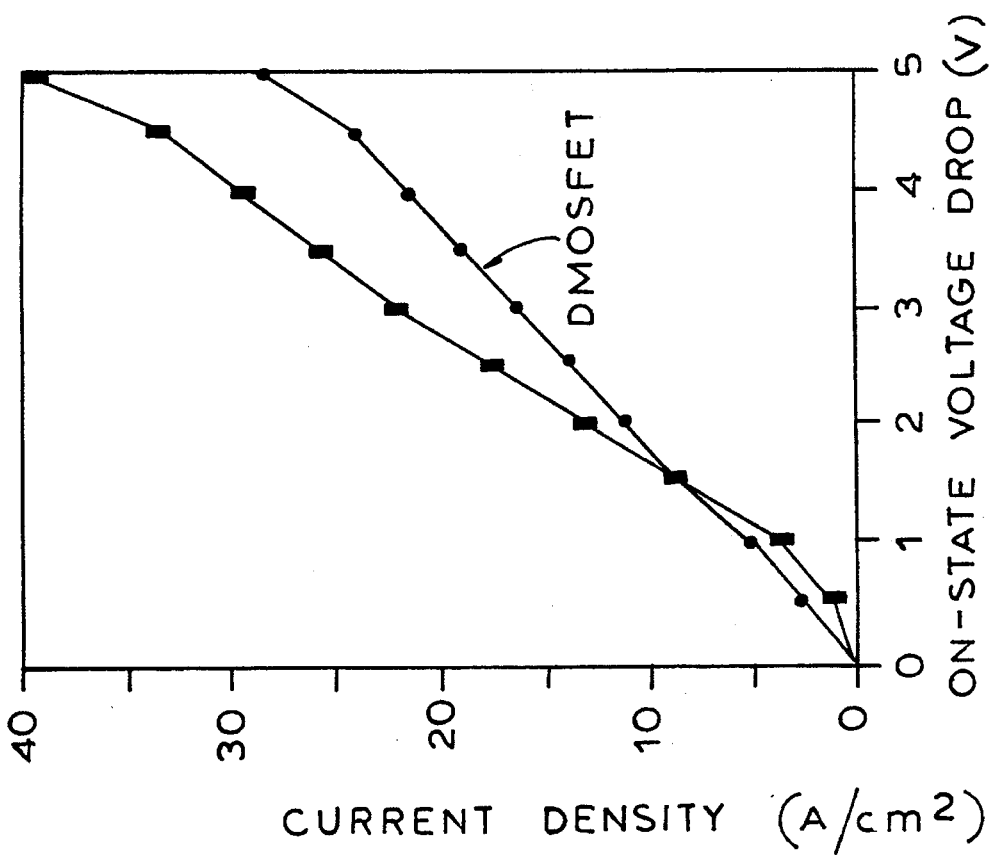

The on-state current conduction characteristics of the device of the present invention (FIG. 2 embodiment) is compared with that of the DMOSFET in FIG. 5A. A "knee" at 0.7 V in the on-state characteristics can be noticed for the device of the present invention, showing the onset of bipolar injection. Below 1.5 V on-state drop, the DMOSFET has a higher current density than the device of the present invention. Above 1.5 V, due to significant bipolar injection and conductivity modulation, the device of the present invention advantageously has a higher current density than the MOSFET.

Specifically, as shown in FIG. 5A, the device of the present invention was measured to have an on-state current density of 25.86 A/cm$^2$ at room temperature at an on-state voltage drop of 3,5 V and gate voltage of 12 V, which is an improvement of 33.4% over the DMOSFET, which was measured to be only 19.39 A/cm$^2$ at an on-state drop of 3.5 V. At an on-state drop of 3 V, the device of the present invention had a current density of 22.17 A/cm$^2$ and, at an on-state drop of 4 V, a current density of 29.56 A/cm$^2$, which is an improvement of 32.6% and 34% respectively over the DMOSFET.

The current density of both the present invention and the DMOSFET decreases with an increase in temperature. This is because the resistance of the N-drift region increases with increase in temperature due to decrease in electron mobility. However, in the device of the present invention, there is increased injection of carriers at higher temperatures due to reduction of junction-barrier potential which partly offsets the increase in the N-drift region resistance. At higher temperatures, the improvement of the present invention over the DMOSFET increased from 46% at 75° C. to 63% at 175° C.

After the above tests were performed, prototypes of the present invention and the DMOSFET devices were assembled in TO-247 packages and switching tests were performed. The present invention turned-off a current density of approximately 22 A/cm$^2$ (300 mA) in 80 ns with a resistive load (1 kΩ) at 300 V when the gate voltage is reduced from 12 V to 0. The turn-off time of the DMOSFET devices fabricated was 80 ns under the same test conditions. The turn-off waveform of the present invention is compared to that of the DMOSFET in FIG. 5B. During turn-off, holes in P base and upper N− drift region of the present invention devices can be swept out faster through the P collector by bringing the gate down to a negative voltage.

The avalanche fail current of the present invention using 200 mH inductive load, 0 V gate voltage and 50 V supply voltage was measured to be 1.1 A, while that of the DMOSFET was 1.3 A.

Accordingly, as demonstrated by the above, the device of the present invention is superior in significant respects to conventional DMOSFET structures.

Figure 6:
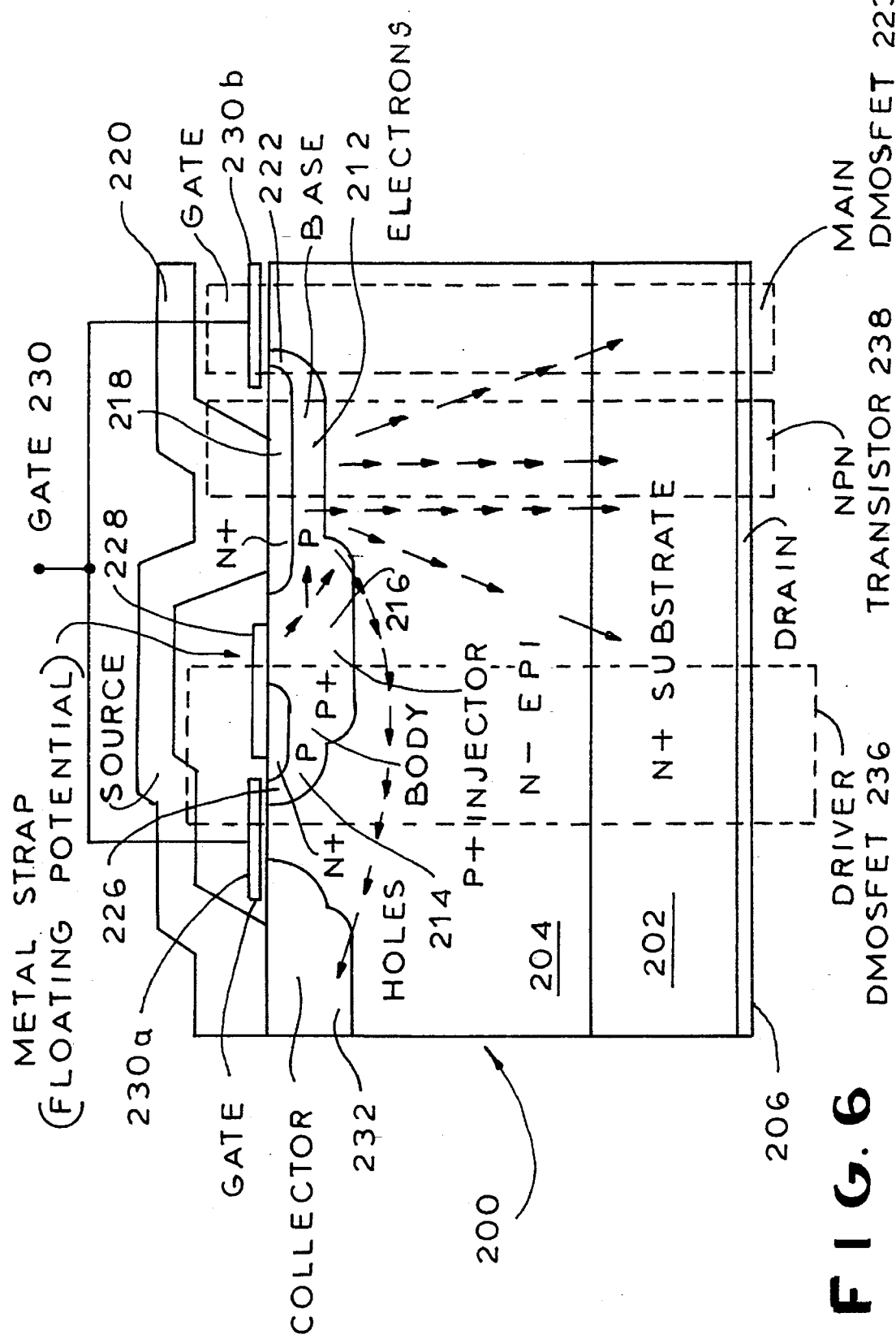
FIG. 6 shows a cross-sectional view of a second embodiment of the present invention.

A second embodiment of the invention is shown in FIG. 6. This embodiment of the invention is conceptually similar to the first embodiment described above, but is more compact in that, in the second embodiment, the P body and P base regions are both contiguous with the P+ injector region.

More specifically, as shown in FIG. 6, this embodiment contains three contiguous P regions disposed within N− epi layer 204 and extending downward into the device from the upper surface, namely a P base region 212, a P body region 214, and a P+ injector region 216. P+ injector region 216 is preferably deeper than P base region 212 and P body region 214 and is disposed between the two.

A N+ emitter region 218, electrically connected to source electrode 220, is disposed within P base 212. N+ emitter region 218 is laterally spaced inwardly from the outer edge of P base 112 to form a n-channel region 222 of main DMOSFET 223.

A N+ region 224 is disposed within P body region 214, located at the opposite side of P injector region 216 from P base 212. N+ region 224 is laterally spaced inward from the outer edge of P body 214 to form a n-channel region 226 of a driver DMOSFET 236, and is electrically shorted to P body 214 by a floating metal strap 228 (unconnected to any electrode of the device) disposed on the upper surface of the device.

A P+ collector region 232, spaced from P injector region 216, extends into N− epi layer 204 from the upper surface of the wafer.

A common insulated gate 230 overlays n-channel regions 222 and 226. As in the first embodiment, insulated gate 230 is preferably comprised of polysilicon and is insulated from the upper surface of the device by a layer of oxide (not shown in FIG. 6). Insulated gate 230 also overlays the portion of N− epi layer 204 which extends upwardly in the space between P body region 214 and P+ collector region 232, as well as the n-channel region 226 at the outer edge of P base 212. P+ collector region 232 is connected to the source electrode, which is typically at ground potential.

The above-described structure yields a device having a driver DMOSFET 236 which provides the base drive for a vertical NPN power transistor 238. As in the first embodiment of the invention, and as opposed to the prior art MICFET, driver DMOSFET 236 is advantageously conductivity modulated. An equivalent circuit for the second embodiment of the invention is shown in FIG. 7.

In the operation of the second embodiment of the invention, with the drain positive with respect to the source and the gate at a positive potential, floating P+ injector region 216 is coupled to the drain potential of the device by driver DMOSFET 236 and injects holes into P base 212, thus providing the base drive for vertical NPN power transistor 238. P+ collector region 232, connected to ground potential, is incorporated in the device structure in a position adjacent to the current path of driver DMOSFET 236 to divert part (about 15%) of the injected holes from P+ injector region 216 to the current path of the driver DMOSFET 236. This conductivity modulates the N− drift region and the JFET region of the driver DMOSFET 236 and reduces its on-resistance. The reduction of on-resistance of the driver DMOSFET 236 brings the potential of the P+ injector region 216 closer to drain potential, leading to increased injection of holes, which leads to further reduction of on-resistance of the driver DMOSFET 236, and so on by this positive feedback mechanism until driver DMOSFET 236 is saturated.

During turn-off, since the injected holes in the second embodiment are again confined to the upper part of the device, they are easily removed through the P+ collector 116 by the electric field, resulting in fast switching characteristics.

In the off state of the device, a high breakdown voltage is achieved by connecting the P base 212 of main NPN transistor 238 to the ground potential of the P+ collector 216 through the p-type inversion channel formed at the surface of the drift region by applying a negative bias (−10 V) to the gate.

Figure 8A:
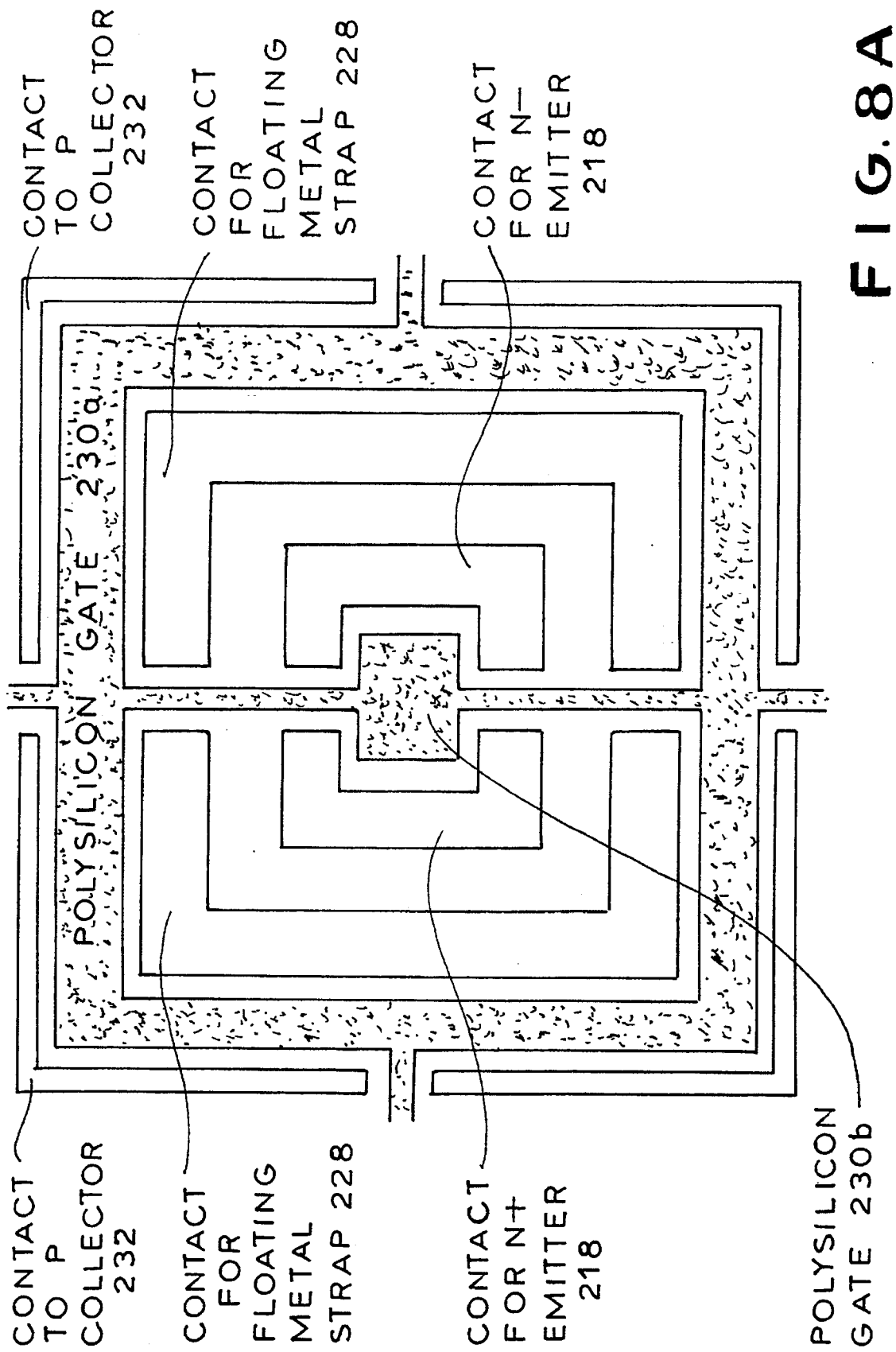
FIG. 8A shows a top view of a full cell of the embodiment of FIG. 6.

Like the first embodiment, the second embodiment of the present invention is preferably provided in a cellular topology, FIG. 6 representing one-half of a unit cell. A top view of a full cell of the device, showing the contacts to the various regions, is depicted in FIG. 8A. A mask layout showing the P$^+$ diffusions, the N$^+$ emitter and the polysilicon is shown in FIG. 8B.

Figure 8B:
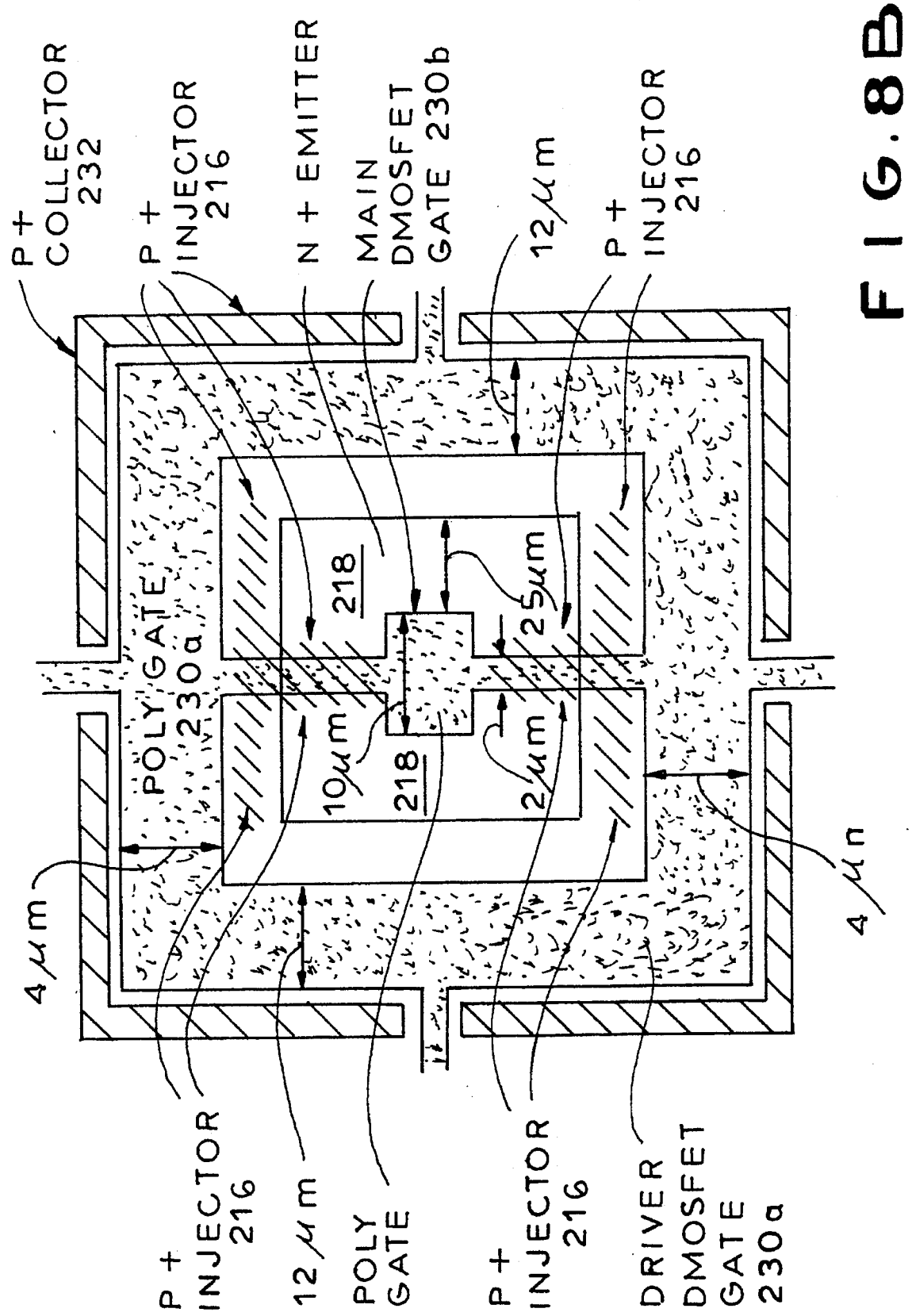
FIG. 8B is a mask layout showing the $P^+$ diffusions, the $N^+$ emitter and the polysilicon for the embodiment of FIG. 6.

In order to evaluate the relative performance of the present invention, ordinary DMOSFET devices and multi-cell devices having the layout shown in FIG. 8B were fabricated, both with breakdown voltages of 750 V. An improvement of 20% in on-state current density for the second embodiment of the invention (22.26 A/cm$^2$) over the DMOSFET (18.63 A/cm$^2$) at an on-state drop of 3.5 V and gate voltage of 6 V was measured. The devices of the second embodiment of the invention show improvement in current density of 14% and 24% at on-state drop of 3 V and 3.5 V respectively over the DMOSFET.

The current density of both the second embodiment of the invention and the MOSFET decreased with temperature. At 75° C., the devices of the present invention showed 38% improvement in current density over DMOSFET. The present invention (second embodiment) turned-off a current density of approximately 24 A/cm$^2$ in 80 ns with a resistive load (1 kΩ) at 300 V when the gate voltage is reduced from 12 V to 0, which is equal to that of a DMOSFET under identical conditions.

The avalanche fail current of the second embodiment of the invention using a 200 mH inductive load and 50 V drain voltage was measured to be 1.3 A equal to that of the DMOSFET.

Figure 9:
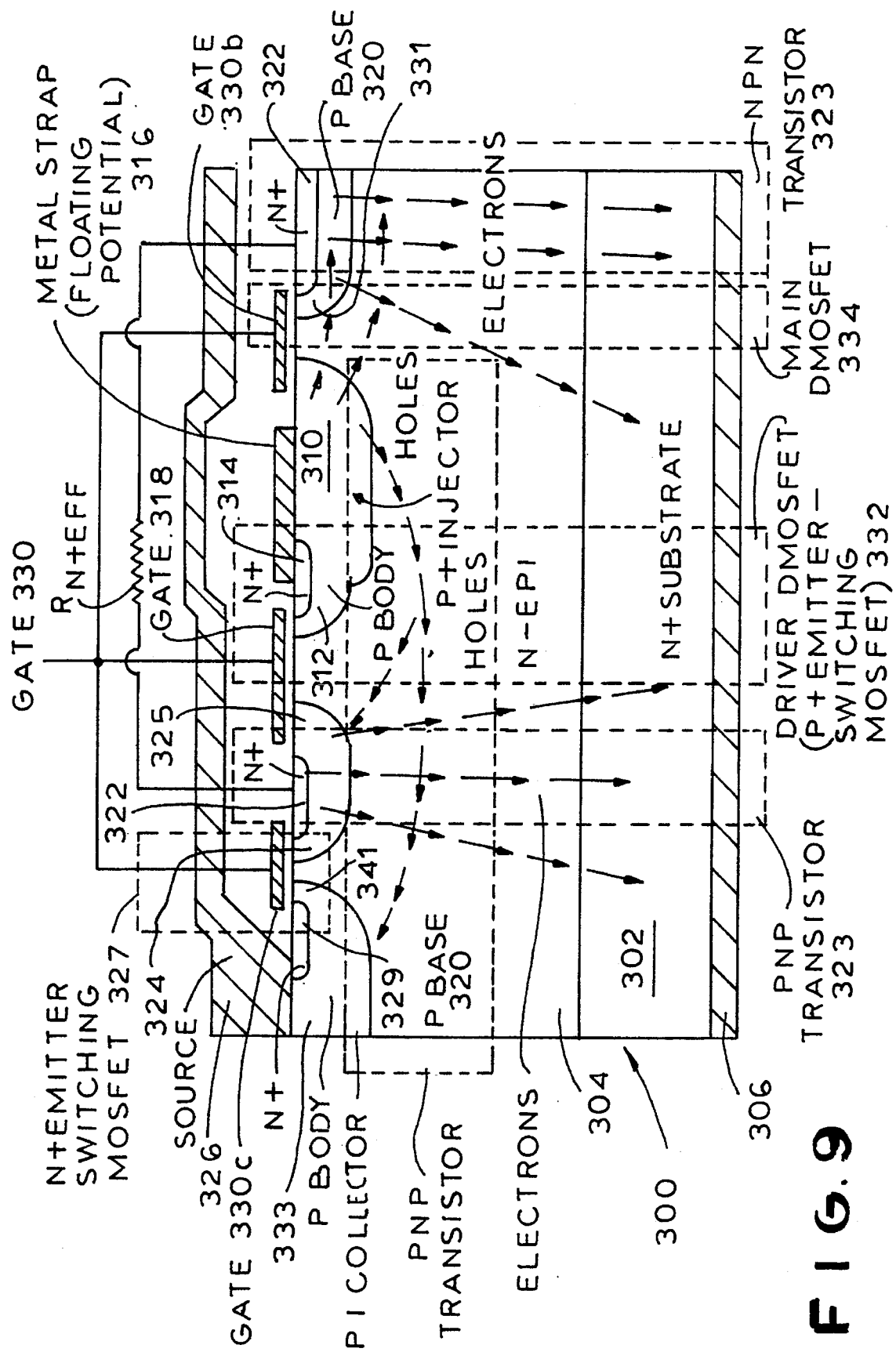
FIG. 9 shows a cross-sectional view of a third embodiment of the present invention.

Referring now to FIG. 9, a third embodiment of the invention is shown, termed an emitter-switched MOS-gated bipolar transistor. This embodiment of the invention differs from the first two embodiments described above in that, instead of connecting the N+ emitter to ground, it is left floating in the off-state and is connected to ground by a lateral n-channel MOSFET in the on-state. This "emitter-switched" structure has a better Safe Operating Area (SOA) than the first two embodiments of the invention.

Figure 10:
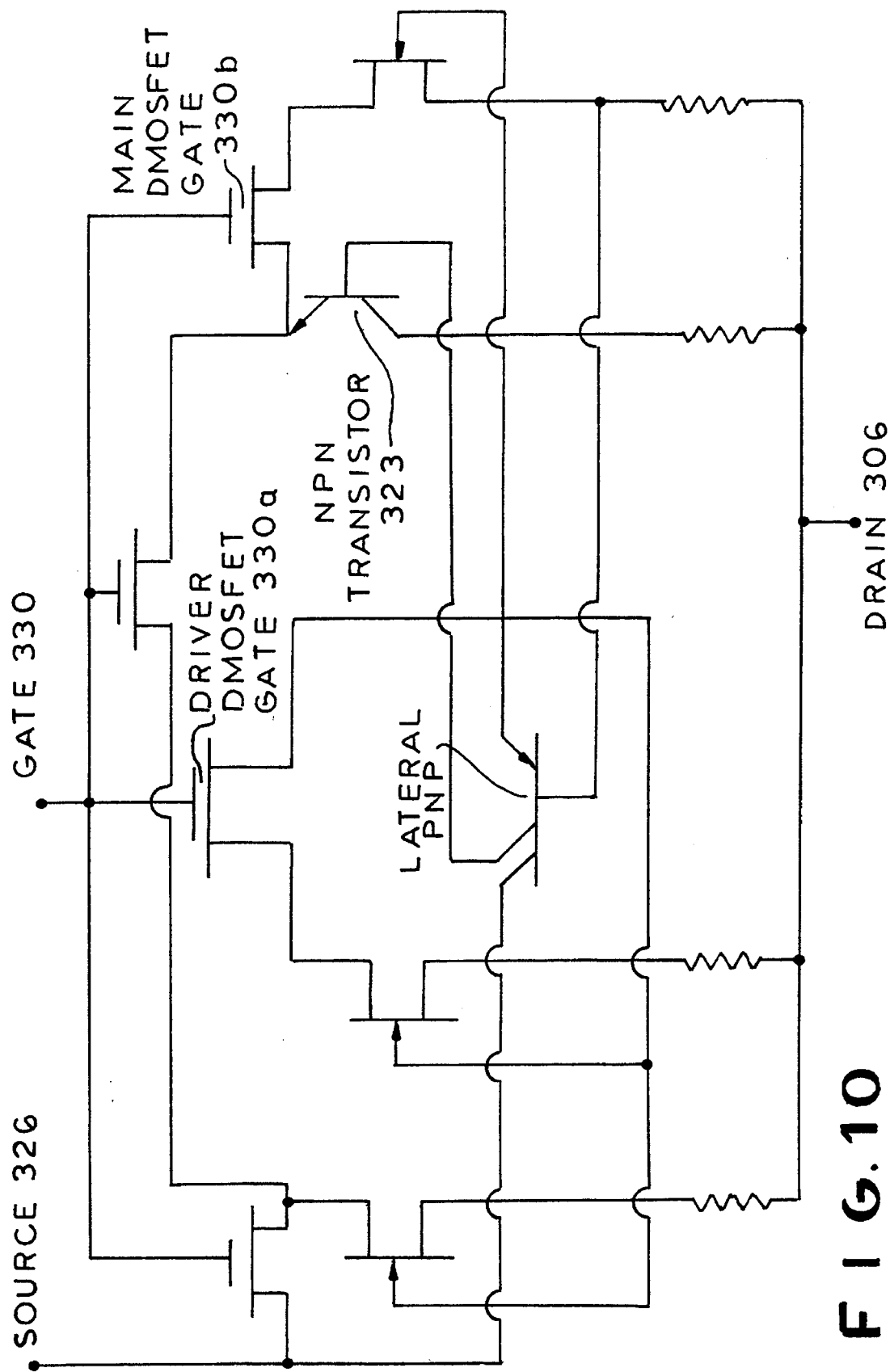
FIG. 10 shows the equivalent circuit of the embodiment of FIG. 9.

Although MOS-controlled bipolar transistors with emitter switching to achieve low on-state voltage drop while having fast-switching characteristics have been previously proposed (see, e.g., J. S. Ajit et al., "Comparison of MOS-Controlled Bipolar Transistor Structures," *Symposium on Materials and Devices for Power Electronics*, September 1991), the emitter-switched embodiment of the present invention, like the devices of the first two embodiments described above, advantageously achieves an improvement in current density over prior devices by driving the base of a vertical NPN power bipolar transistor with a driver DMOSFET which is conductivity modulated by a positive feedback mechanism. An equivalent circuit of the emitter-switched embodiment of the invention is shown in FIG. 10.

More specifically, referring back to FIG. 9, the emitter-switched device 300 of the present invention, as in the previous embodiments, is preferably formed on a N+ substrate 302 with an overlying N− epi layer 304. The N+ substrate 302 serves as the drain region of the device. A drain electrode 306 on the bottom surface of the device covers N$^+$ substrate 302. The layer thicknesses and concentrations are similar to the first embodiment of the invention.

A P+ injector region 310 is disposed within N$^−$ epi layer 304 and extends downward into the device from the upper surface. As shown in FIG. 9, a P body region 312 is contiguous with P+ injector region 310, is disposed on one side thereof and extends preferably to a shallower depth than P+ injector region 310.

A N$^+$ region 314 is formed in P body region 312. N+ region 314 is electrically shorted to P body 312 by a floating metal strap 316 (unconnected to any electrode of the device) disposed on the upper surface of the device. N+ 314 is laterally spaced inward from the outer edge of P body 312 to form a n-channel region 318 of a driver DMOSFET (P+ emitter-switching MOSFET) 332.

A P base region 320 is also disposed within N$^−$ epi layer 304 and extends downward into the device from the upper surface in spaced relationship to P+ injector region 310. A N+ emitter region 322 of a vertical NPN transistor 323 is formed in P base 320. As shown in the top views of FIGS. 11A and 11B, in the layout of the device, N+ emitter region 322 surrounds P+ injector region 310.

N+ emitter region 322 is laterally spaced inwardly from the outer edges of P base 320 to form respective n-channel regions 331, 324, n-channel region 324 (the channel on the left side of P base 320 in FIG. 9) forming a part of a N+ emitter switching MOSFET 327 of the device. N+ emitter region 322 is not connected to the source electrode in this embodiment of the invention.

A P+ collector region 328, spaced from P+ injector region 310 and on the same side of N+ region 314 from P+ injector region 310, also extends into N− epi layer 304 from the upper surface of the wafer. A N+ source region 329 is contained within a P body region 333 disposed preferably above and contiguous with P+ collector region 328. Both N+ source 329 and P body region 333 are connected to a source electrode 326 on the upper surface of the device. Source electrode 326 is typically held at ground potential.

As shown in FIG. 9, N+ source region 329 is spaced radially inwardly from the edge of P body region 333 to form a second n-channel region 341 of N+ emitter-switching MOSFET 327.

A common insulated gate 330 overlays n-channel regions 318, 324, 341, and 331 and also extends over the adjacent portions of N– epi layer 304 which project upwardly in the spaces between P body region 333 and P base region 320, and between P base region 320 and P body region 312/P injector region 310. Insulated gate 330 is preferably comprised of polysilicon and is insulated from the upper surface of the device by a layer of oxide (not shown in FIG. 9).

As in the first and second embodiments of the invention described above, P+ injector region 310, coupled to the drain potential by a vertical driver DMOSFET 332, is used to inject holes in the on-state of the device. As in the previous embodiments, approximately 85% of the injected holes provide the base drive for vertical NPN transistor 323 while simultaneously conductivity modulating the JFET region of a main power DMOSFET 334. The remaining 15% of the holes are diverted back to conductivity modulate the driver DMOSFET 332. The hole diversion occurs because of the electric field caused by P+ collector region 328 connected to ground potential.

As in the other embodiments, the reduction of on-resistance of driver DMOSFET 332 causes the potential of the P+ injector region 310 to increase close to the drain potential, leading to increase injection of holes, which in turn leads to further reduction of forward voltage drop, and so on by way of this positive feedback mechanism until the driver DMOSFET 332 saturates.

Advantageously, in the off-state of the device, with a zero potential applied to gate 330, the N+ emitter 322 of the NPN transistor 323 is left floating, which leads to fast switching characteristics and good Safe Operating Area (SOA) for the device. During turn-off, the excess electrons in the N– drift region 304 are removed through the N+ drain 302, and since the injected holes are confined to the upper part of the device, they are easily removed through the P collector region 328 by the electric field. This allows for faster switching than an IGBT, in which the excess electrons are trapped near the P+ substrate/N– drift region junction at the bottom of the device during turn-off, and the injected holes are distributed in the lower part of the drift region.

Figure 11A:
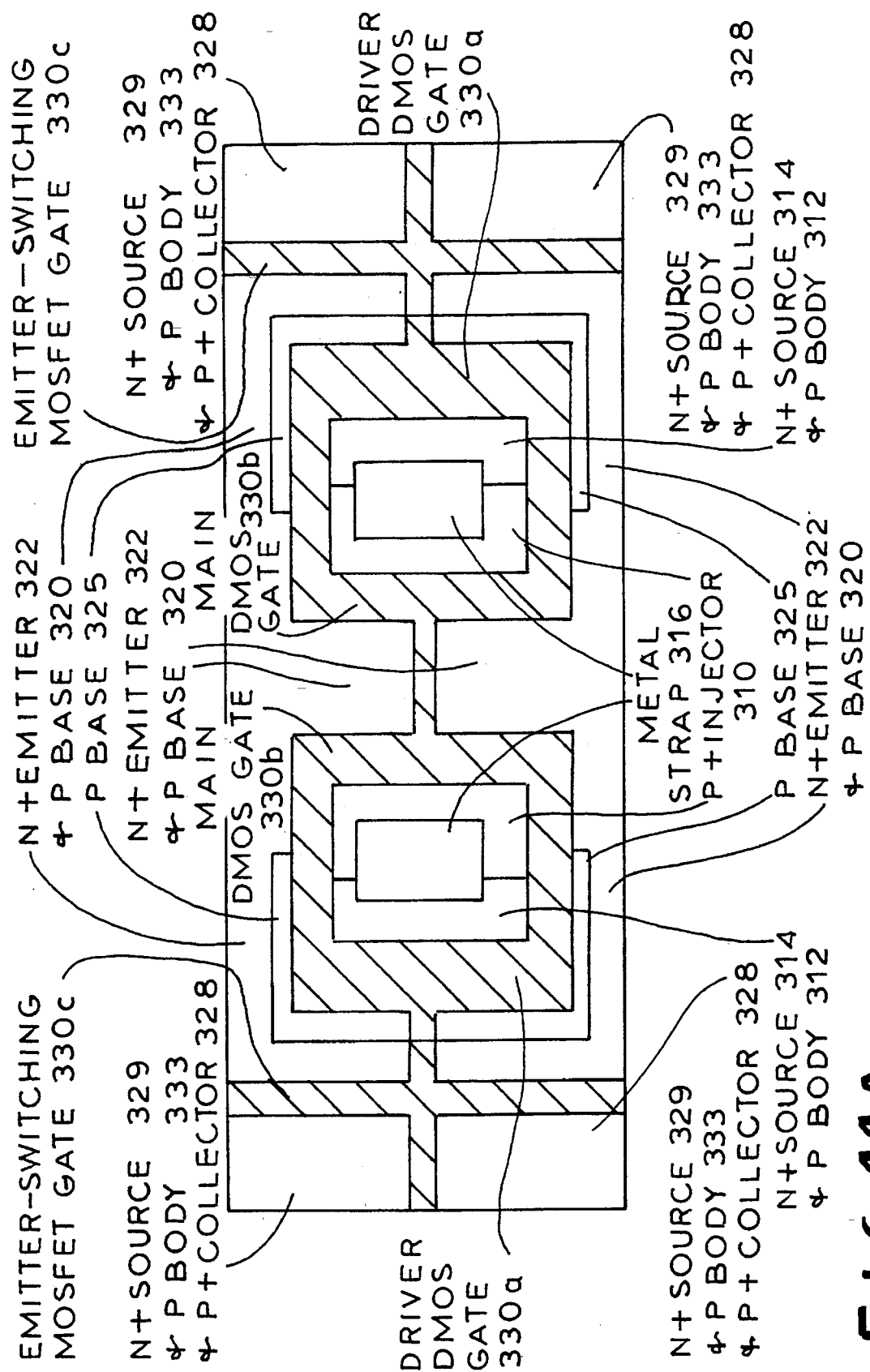
FIG. 11A shows a top view of a unit cell of the emitter-switched embodiment of FIG. 9 provided in a cellular topology.
Figure 11B:
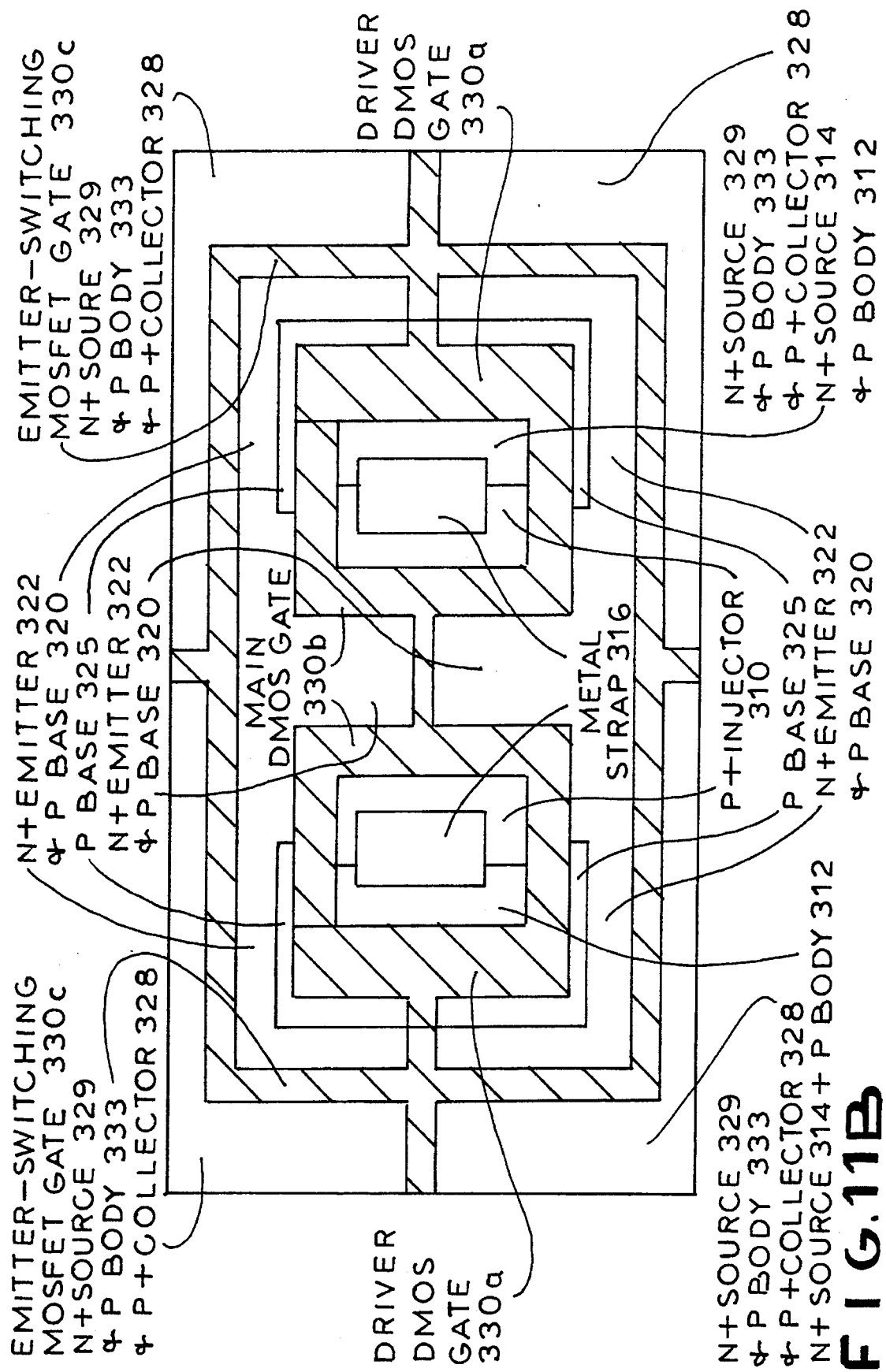
FIG. 11B shows an alternate layout of a unit cell of the emitter-switched embodiment of FIG. 9.

Like the first and second embodiments of the invention, the emitter-switched embodiment of the present invention is preferably provided in a cellular topology, FIG. 9 representing one-half of a unit cell. A top view of a unit cell of the device is depicted in FIG. 11A. An alternate layout of a unit cell of the device is depicted in FIG. 11B.

Figure 12B:
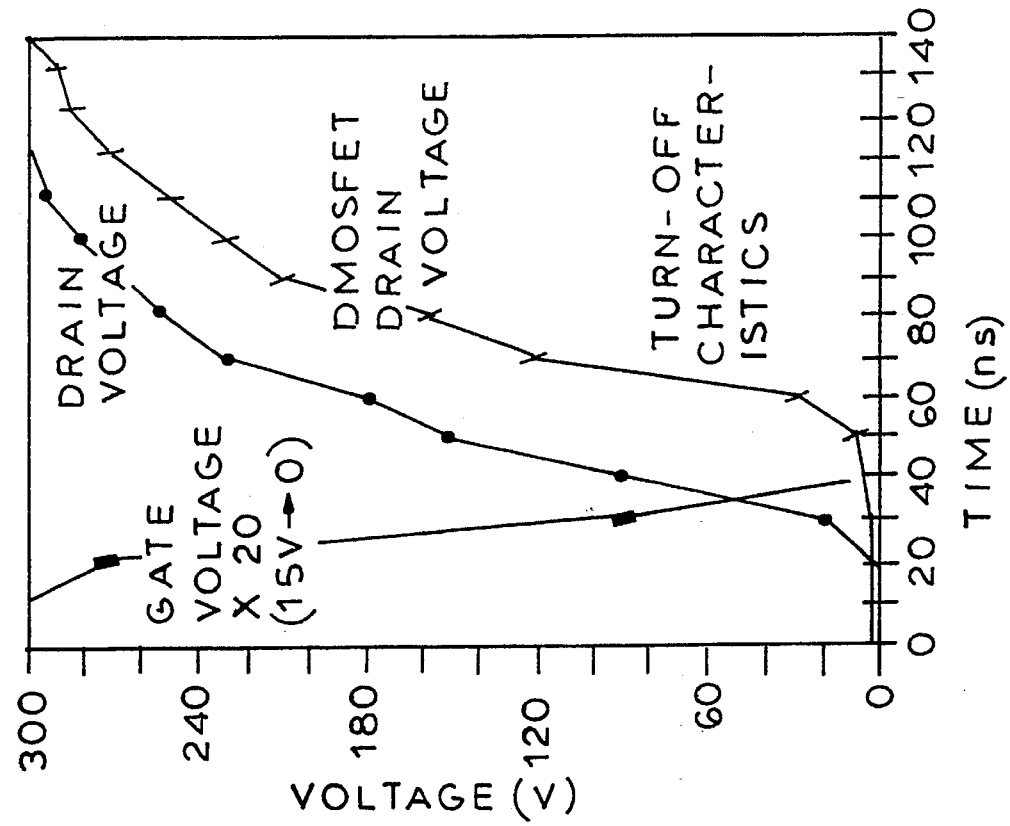
FIGS. 12A and 12B show the relative performance of the emitter-switched embodiment of the invention as compared to a conventional DMOSFET.
Figure 12A:
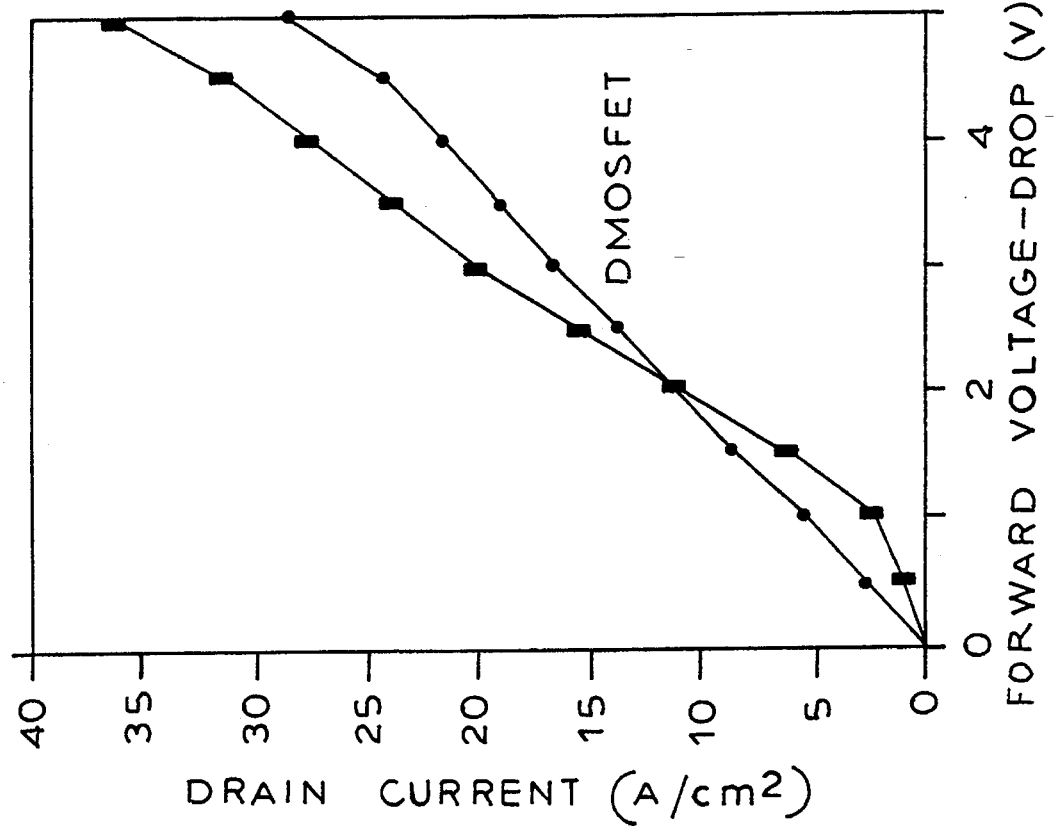

The relative performance of the emitter-switched embodiment as compared to ordinary DMOSFET devices is shown in FIGS. 12A and 12B.

Figure 13:
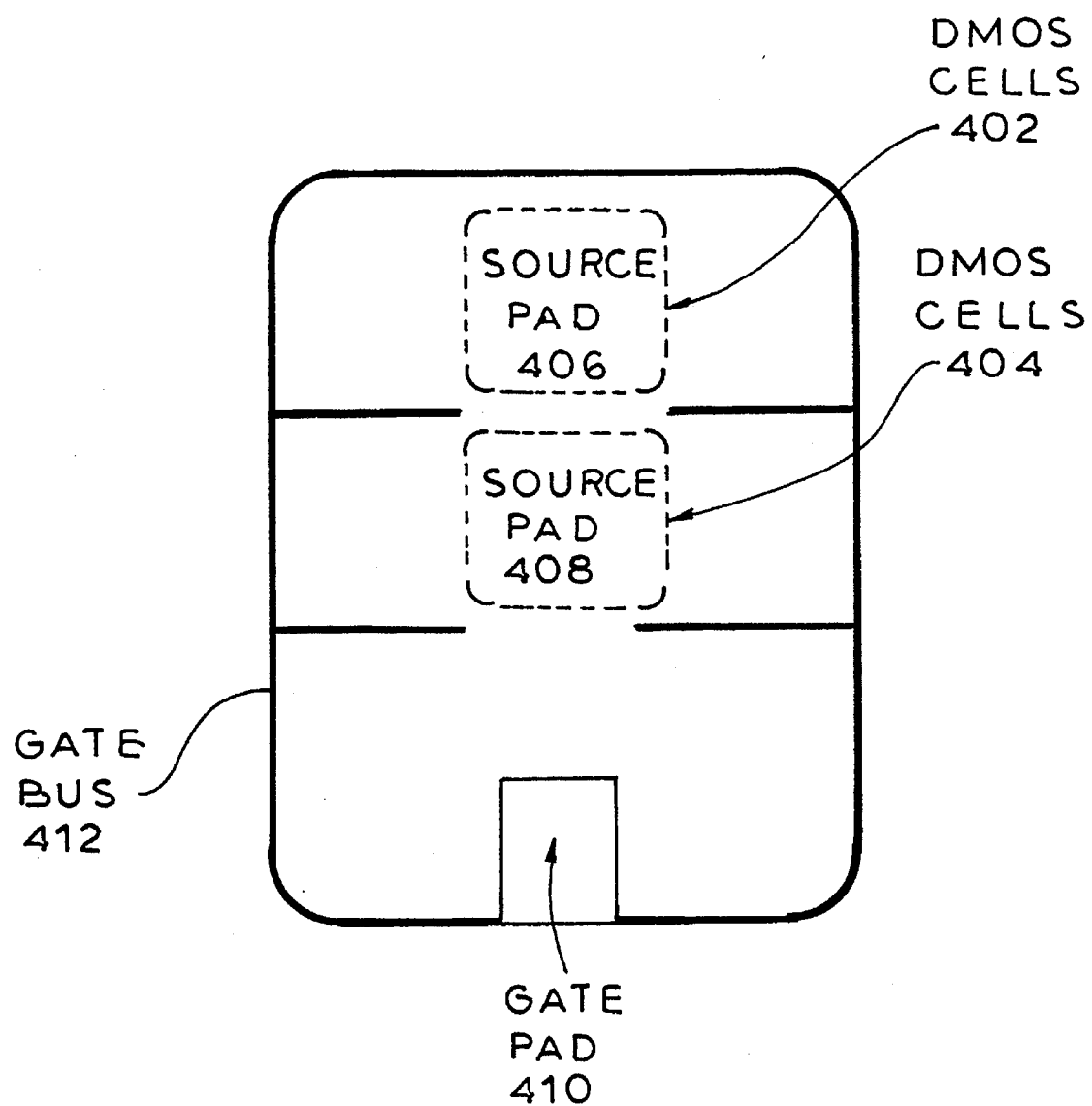
FIG. 13 shows a top view of a die layout of the various embodiments of the present invention using a floating metal strap in addition to the source metal.

In the embodiments of the invention described above and other device structures where a floating metal strap is used in addition to a source metal, the devices can be fabricated by a two-layer metal process or by using a single-layer metal with active area wire bonding with a chip layout as shown in FIG. 13.

In the chip layout of FIG. 13, DMOS cells 402, 404 are formed in the regions of the chip where source wire bonding is done (source pads 406, 408). DMOS cells 402, 404 conduct in parallel to the main device, so that the source bonding area (source pads 406, 408) is also utilized for current conduction. The respective locations of the gate wire bonding area (gate pad 410) and gate bus 412 are also shown in FIG. 13.

In summary, the present invention, in each of the three embodiments described above, possesses significant advantages over conventional DMOSFET and bipolar devices. The most significant advantages of the invention are as follows:

1. Significant improvement (in the range of 30%–50%) in on-state current density over a DMOSFET with comparable switching times. Also, the input capacitance of the present invention is lower than that of a DMOSFET. Hence, the present invention has reduced power losses compared to the DMOSFET in power electronic circuits.

2. Forward biased secondary breakdown phenomena, which limits use of bipolar transistors, is absent in the present invention. This is because even though a major portion of the current flow is bipolar, it is still fully controlled by a driver DMOSFET. The on-resistance of a DMOSFET increases with temperature. Hence, the thermal instability characteristic of bipolar transistors is absent in the devices of the present invention.

3. Avalanche current flows mainly through the P collector region in the present invention, and this yields significant protection for the device from reverse biased secondary breakdown of the NPN bipolar transistor and significant avalanche immunity. The reversed biased secondary breakdown limit can be increased by reducing the P base resistance and by making use of a JFET pinch-off of the N– epi region below the NPN transistor by P+ collector regions. Reducing the NPN base resistance in the present invention will not affect the on-state current density significantly because the P base is in high level injection in the on-state.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOS-gate controlled power bipolar semiconductor device, comprising:

a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped N+ substrate, a drain electrode being electrically connected to said second semiconductor surface;

a P injector region formed in said relatively lightly doped N-type layer and extending into said relatively lightly doped N-type layer from said first semiconductor surface, said P injector region being contiguous with a P body region also extending into said relatively lightly doped N-type layer from said first semiconductor surface;

a first N-type region formed in said P body region, said first N-type region being electrically connected, by a metal strap disposed at said first semiconductor surface, to the P body region, said metal strap being at a floating potential, said first N-type region being shallower than the P body region in which it is formed and being radially inwardly spaced along said first semiconductor surface from an outer edge of said P body region, such that said outer edge of said P body region extends to said first semiconductor surface, thereby defining an n-channel region of a driver DMOSFET of said device, said driver DMOSFET having a current path extending through said relatively lightly doped N-type region;

a P base region formed in said relatively lightly doped N-type layer and extending into said relatively lightly doped N-type layer from said first semiconductor surface, said P base region being laterally spaced from said P injector region by a first portion of said relatively lightly doped N-type region to define a JFET region;

a second N-type region formed in said P base region, said second N-type region being electrically connected to a source electrode at the first semiconductor surface of the device, said second N-type region being shallower than said P base region and radially inwardly spaced along said first semiconductor surface from an outer edge of said P base region, such that said outer edge of said P base region adjacent said JFET region extends to said first semiconductor surface, thereby defining an n-channel region of a main DMOSFET of said device;

a P-type collector region formed in said relatively lightly doped N-type layer and laterally spaced from said P body region by a second portion of said relatively lightly doped N-type region, said P-type collector region being connected to said source electrode;

an insulated gate disposed over said n-channel region of said main DMOSFET, said n-channel region of said driver DMOSFET and said first and second portions of said relatively lightly doped N-type region, whereby, upon the application of a positive potential to said insulated gate, said main DMOSFET and said driver DMOSFET are turned on, the turning-on of said main DMOSFET providing a base drive for a lateral PNP transistor defined by said P injector region, said relatively lightly doped N-type layer and said P base region, the turning-on of said driver DMOSFET resulting in an increased potential at said P injector region and causing holes to be injected from said P injector region into said lightly doped N-type region and into said P base region to provide base drive for a vertical NPN transistor structure defined by said second N-type region, said P base region and said relatively lightly doped N-type layer, the P-type collector region diverting a portion of the injected holes to the current path of said driver DMOSFET, thereby conductivity modulating said driver DMOSFET and reducing the on-resistance of said driver DMOSFET, leading to increased injection of holes from said P injector region and further decreasing the on-resistance of said driver DMOSFET, resulting in a further increased injection of holes by way of a positive feedback mechanism until said driver MOSFET saturates.

2. A MOS-gate controlled power bipolar semiconductor device as recited in claim 1, wherein said device is provided in a cellular topology.

3. A MOS-gate controlled power bipolar semiconductor device, comprising:

a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped N+ substrate, a drain electrode being electrically connected to said second semiconductor surface;

a P injector region extending into said relatively lightly doped N-type layer from said first semiconductor surface, said P injector region being contiguous with a P base region and a P body region also extending into said relatively lightly doped N-type layer from said first semiconductor surface;

a first N-type region formed in said P base region, said first N-type region being electrically connected to a source electrode at the first semiconductor surface of the device, said first N-type region being shallower than said P base region and radially inwardly spaced along said first semiconductor surface from an outer edge of said P base region, such that said outer edge of said P base region extends to said first semiconductor surface, thereby defining an n-channel region of a main DMOSFET of said device adjacent to a first portion of said relatively lightly doped N-type layer defining a JFET region of said main DMOSFET;

a second N-type region formed in said P body region, said second N-type region being electrically connected, by a metal strap disposed at said first semiconductor surface, to said P body region, said metal strap being at a floating potential, said second N-type region being shallower than said P body region and being radially inwardly spaced along said first semiconductor, surface from an outer edge of said P body region, such that said outer edge of said P body region extends to said first semiconductor surface, thereby defining an n-channel region of a driver DMOSFET of said device, said driver DMOSFET having a current path extending through said relatively lightly doped N-type region;

a P-type collector region formed in said relatively lightly doped N-type layer and spaced from said P body region by a second portion of said relatively lightly doped N-type layer, said P-type collector region being connected to said source electrode;

an insulated gate disposed over said n-channel region of said main DMOSFET, said n-channel region of said driver DMOSFET and said first and second portions of said relatively lightly doped N-type layer, whereby, upon the application of a positive potential to said insulated gate, said main DMOSFET and said driver DMOSFET are turned on, the turning-on of said main DMOSFET providing a base drive for a lateral PNP transistor structure in said device defined by said P injector region, said relatively lightly doped N-type layer and said P base region, the turning-on of said driver DMOSFET resulting in an increased potential at said P injector region and causing holes to be injected from said P injector region into said lightly doped N-type layer and said P base region to provide base drive for a vertical NPN transistor structure defined by said first N-type region, said P base region and said relatively lightly doped N-type Layer, the P-type collector region diverting a portion of the injected holes to the current path of said driver DMOSFET, thereby conductivity modulating said driver DMOSFET and reducing the on-resistance of said driver DMOSFET, leading to increased injection of holes from said P injector region and further decreasing the on-resistance of said driver DMOSFET, resulting in a further increased injection of holes by way of a positive feedback mechanism until said driver DMOSFET saturates.

4. A MOS-gate controlled power bipolar semiconductor device as recited in claim 3, wherein said device is provided in a cellular topology.

5. A MOS-gate controlled power bipolar semiconductor device, comprising:

a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped N+ substrate, a drain electrode being electrically connected to said second semiconductor surface;

a P injector region formed in said relatively lightly doped N-type layer and extending into said relatively lightly doped N-type layer from said first semiconductor surface, said P injector region being contiguous with a first P body region also extending into said relatively lightly doped N-type layer from said first semiconductor surface;

a first N-type region formed in said first P body region, said first N-type region being electrically connected, by a metal strap disposed at said first semiconductor surface, to the first P body region, said metal strap being at a floating potential, said first N-type region being shallower than the first P body region in which it is formed and being radially inwardly spaced along said first semiconductor surface from an outer edge of said first P body region, such that said outer edge of said first P body region extends to said first semiconductor surface, thereby defining an n-channel region of a driver DMOSFET of said device, said driver DMOSFET having a current path extending through said relatively lightly doped N-type region;

a P base region formed in said relatively lightly doped N-type layer and extending into said relatively lightly doped N-type layer from said first semiconductor surface, said P base region surrounding said P injector region and said first P body region, said P base region being laterally spaced from said P injector region and said first P body region by a first portion of said relatively lightly doped N-type region to define a JFET region;

a second N-type region formed in said P base region, said second N-type region being at a floating potential, said second N-type region being shallower than said P base region and radially inwardly spaced along said first semiconductor surface from an outer edge of said P base region, such that said outer edge of said P base region adjacent said JFET region extends to said first semiconductor surface, thereby defining an n-channel region in areas of a main DMOSFET of said device and defining a first n-channel region in a first area of an emitter-switching MOSFET defined by said second N-type region, said P base region and said relatively lightly doped N-type layer;

a P-type collector region formed in said relatively lightly doped N-type layer and laterally spaced from said P base region by a second portion of said relatively lightly doped N-type region, said P-type collector region being connected to said source electrode;

a N+ source region contained within a second P body region contiguous with the P-type collector region, said N+ source region being shallower than said second P body region and radially inwardly spaced along said first semiconductor surface from an outer edge of said second P body region, such that said outer edge of said second P body region extends to said first semiconductor surface, thereby defining a second n-channel region in a second area of said emitter-switching MOSFET defined by said N+ source region, said second P body region and said relatively lightly doped N-type layer;

an insulated gate disposed over said n-channel region of said main DMOSFET, said n-channel region of said driver DMOSFET, said first and second n-channel regions of said emitter-switching MOSFET, and said first and second portions of said relatively lightly doped N-type region, whereby, upon the application of a positive potential to said insulated gate, said main DMOSFET, said driver DMOSFET, and said emitter-switching MOSFET are turned on, the turning-on of said emitter-switching MOSFET resulting in an increased potential at said second N-type region, the turning-on of said main DMOSFET providing a base drive for a lateral PNP transistor structure defined by said P injector region, said lightly doped N type layer and said P base region, the turning-on of said driver DMOSFET resulting in an increased potential at said P injector region and causing holes to be injected from said P injector region into said lightly doped N-type layer and P base region to provide base drive for said vertical NPN transistor structure defined by said second N-type region, said P base region and said relatively lightly doped N-type layer, the P-type collector region diverting a portion of the injected holes to the current path of said driver DMOSFET, thereby conductivity modulating said driver DMOSFET and reducing the on-resistance of said driver DMOSFET, leading to increased injection of holes from said P injector region and further decreasing the on-resistance of said driver DMOSFET, resulting in a further increased injection of holes by way of a positive feedback mechanism until said driver DMOSFET saturates.

6. A MOS-gate controlled power bipolar semiconductor device as recited in claim 5, wherein said device is provided in a cellular topology.

7. A MOS-gate controlled power bipolar semiconductor device, comprising:

a wafer of semiconductor material having first and second spaced, parallel planar surfaces, at least a portion of the thickness of said wafer which extends from said first semiconductor surface comprising a relatively lightly doped layer of a first conductivity type for receiving junctions;

an injector region of a second conductivity type formed in said relatively lightly doped layer and extending into said relatively lightly doped layer from said first semiconductor surface said injector region being contiguous with a body region of said second conductivity type also extending into said relatively lightly doped layer from said first semiconductor surface;

a first region of said first conductivity type formed in said body region, wherein said first region, said body region and said relatively lightly doped layer define a driver MOSFET which, when activated upon application of a gate potential at said first surface over said body region, electrically couples said injector region to a potential of a drain electrode at said second semiconductor surface; and a collector region of a second conductivity type formed in said relatively lightly doped layer and extending into said relatively lightly doped layer from said first semiconductor surface, said collector region diverting holes injected by said injector region, such that said diverted holes flow through a current path of said driver MOSFET, thereby conductivity-modulating a portion of said driver MOSFET and reducing the on-resistance of said driver MOSFET, leading to increased injection of holes from said injector region and further decreasing the on-resistance of said driver MOSFET, resulting in a further increased injection of holes by way of a positive feedback mechanism until said driver MOSFET saturates.

8. A MOS-gate controlled power bipolar semiconductor device as recited in claim 7, wherein said device is provided in a cellular topology.

* * * * *